United States Patent
Schneweis

(10) Patent No.: US 7,919,143 B2
(45) Date of Patent: Apr. 5, 2011

(54) CARRIER FOR RECEIVING AN OBJECT AND METHOD FOR THE PRODUCTION OF A CARRIER

(75) Inventor: Stefan Schneweis, Graevenwiesbach (DE)

(73) Assignee: Schunk Kohlensteofftechnik GmbH, Heuchelhein (DE)

( * ) Notice: Subject to any disclaimer, the term of this patent is extended or adjusted under 35 U.S.C. 154(b) by 62 days.

(21) Appl. No.: 10/581,739

(22) PCT Filed: Dec. 6, 2004

(86) PCT No.: PCT/EP2004/013838
§ 371 (c)(1),
(2), (4) Date: Jun. 6, 2006

(87) PCT Pub. No.: WO2005/059992
PCT Pub. Date: Jun. 30, 2005

(65) Prior Publication Data
US 2007/0110975 A1     May 17, 2007

(30) Foreign Application Priority Data
Dec. 9, 2003 (DE) ............ 103 57 698

(51) Int. Cl.
*C23C 16/00* (2006.01)
(52) U.S. Cl. ............ 427/249.2; 427/249.1; 427/249.3; 427/249.4; 427/249.15; 427/249.16; 427/255.11; 427/255.12; 427/255.15; 427/255.18; 427/255.23; 427/255.28
(58) Field of Classification Search .......... 427/228, 427/248.1, 249.1, 249.2, 249.3, 249.15, 900
See application file for complete search history.

(56) References Cited

U.S. PATENT DOCUMENTS

| | | | | |
|---|---|---|---|---|
| 4,115,528 | A | * | 9/1978 | Christner et al. ........ 423/447.4 |
| 5,132,145 | A | * | 7/1992 | Valentian ............... 427/249.4 |
| 5,352,484 | A | * | 10/1994 | Bernard et al. ............ 427/228 |
| 5,397,595 | A | * | 3/1995 | Carroll et al. ............ 427/228 |
| 6,444,027 | B1 | | 9/2002 | Yang |
| 6,455,107 | B1 | * | 9/2002 | Sekhar et al. ............. 427/419.2 |
| 2002/0076491 | A1 | * | 6/2002 | Delperier et al. ........ 427/248.1 |

(Continued)

FOREIGN PATENT DOCUMENTS

DE    10145686    4/2003

(Continued)

OTHER PUBLICATIONS

"The Development of Orientation in Mesophase Pitch During Fiber Formation", J. J. McHugh and D.D. Edie; presented at the $22^{nd}$ Biennial Conference of the American Carbon Society Jul. 17, 1995.*

(Continued)

*Primary Examiner* — Timothy H Meeks
*Assistant Examiner* — Michael G Miller
(74) *Attorney, Agent, or Firm* — Dennison, Schultz & MacDonald

(57) ABSTRACT

A carrier for an object, preferably a substrate of a semiconductor component such as a wafer, includes a receiving element for the object and gas outlets arranged below the receiving element along the object received. At least sections of the carrier are made of a material which including stabilizing fibers and having a porosity which forms the gas outlets, in order to enable a desired gas to exit from the gas outlets in a dosed and finely distributed manner.

7 Claims, 3 Drawing Sheets

U.S. PATENT DOCUMENTS

2003/0160044 A1 8/2003 Besmann

FOREIGN PATENT DOCUMENTS

| EP | 2172822 | 10/1986 |
| --- | --- | --- |
| JP | 60254610 | 12/1985 |
| JP | 03246931 | 11/1991 |
| JP | 08181150 | 11/1991 |
| JP | 09209152 | 8/1997 |
| JP | 11035391 | 2/1999 |
| JP | 2000031098 | 1/2000 |
| WO | 03049157 | 6/2003 |

OTHER PUBLICATIONS

Printout of the Proceedings of the 22$^{nd}$ Biennial Conference of the American Carbon Society, accessed May 7, 2010 at http://acs.omnibooksonline.com/ via the 1995 link.*

* cited by examiner

CARRIER FOR RECEIVING AN OBJECT AND METHOD FOR THE PRODUCTION OF A CARRIER

This application is a filing under 35 USC 371 of PCT/EP2004/013838, filed Dec. 6, 2004.

BACKGROUND OF THE INVENTION

The invention relates to a substrate for substrate designed to support an object for processing, such as a substrate for a semiconductor element, wherein the substrate contains carbon and is designed to be porous so as to form gas outlet or gas passage openings. The invention further relates to a method for producing a substrate designed to support an object for processing, preferably a substrate for a semiconductor element such as a wafer, wherein the substrate is designed using carbon, giving it a level of porosity that allows the formation of gas outlet or gas passage openings.

Substrates of this type can be used, for example, in CVD processes. In such processes, the gas flow escaping from the substrate through gas outlet openings can ensure that autodoping by dopant atoms, which permeate the object, is prevented by the gas, which carries said atoms away (see U.S. Pat. No. 6,444,027).

In order to also clean the back surface of a flat object in a process chamber, according to U.S. Pat. No. 5,960,555 a susceptor is provided, which is equipped with openings via which the cleaning gas flows onto the back surface.

According to JP-A-10223545, a susceptor for a CVD arrangement is equipped with bored holes via which dopant atoms escaping on the back surface of an object to be doped from the front surface are carried away.

GB-A-2 172 822 relates to a porous support device comprised of fibers, through which air is suctioned for the purpose of holding a work piece in place.

To handle objects without contact with them, according to DE-A-101 45 686 a circular plate arrangement is proposed, which is equipped with through holes through which compressed gas is fed. Alternatively, open-pored materials can be used. Such materials can be of any type, such as, for example, glass.

In WO-A-03/049157 a transport device for wafers is described. The device is comprised of carbon fiber-reinforced material, which has on its surface an electrically conductive polymer, in order to prevent charging.

A susceptor according to JP-A-1 1035391 is comprised of a closed body made of carbon material. A corresponding susceptor is also described in US-A-2003/0160044, which is comprised of carbon and has a closed surface.

A susceptor of lower mass made of glassy carbon with a SiC coating is known from JP-A-08181150. The silicon carbide coating makes the susceptor gas impermeable.

According to JP-A-03246931, to allow the even distribution of heat a susceptor made of carbon material and carbon fibers is proposed, which is comprised of two mutually spaced plates. Bored holes extend in the hollow space that forms between the plates. In order to prevent contaminants from escaping from the base material, the surface is sealed with a SiC film.

In order to process a substrate, according to JP-A-09209152 the substrate is mounted on a ring made of a carbon fiber-reinforced material, which is provided on the outer surface with a SiC coating.

A susceptor made of porous carbon is disclosed in JP-A-60254610.

A suction device according to JP-A-2000031098 provides for a body made of synthetic resin, carbon and ebonite, with vertically extending pores designed to fix an object on the substrate material by means of vacuum pressure.

SUMMARY OF THE INVENTION

The object of the present invention is to further develop a substrate of the type described at the beginning and a method for producing said substrate such that a desired gas can escape, in the proper proportions and finely dispersed, through gas outlet openings that are present in the substrate. At the same time, it is supposed to create the possibility of heating the gas to the desired, defined extent. Further, a high level of stability is to be created. And finally, the possibility of producing substrates of desired dimensions in a simple manner is to be fulfilled.

To attain the object, the invention provides essentially that the substrate is comprised of a framework or a segment of a framework made of carbon fibers and/or SiC fibers, that the fibers are embedded in a matrix made of carbon and/or SiC, and that the substrate has a porosity p of $5\% \leqq p \leqq 95\%$, especially $10\% \leqq p \leqq 95\%$, and a density ρ of $0.1\ \text{g/cm}^3 \leqq \rho \leqq 3.0\ \text{g/cm}^3$. Especially, the substrate material is stabilized by means of vapor infiltration and/or fluid impregnation. The framework may be comprised of felt, fleece and/or fabric layers.

The stabilization or reinforcement of the fibers is accomplished by means of chemical vapor infiltration (CVI) and/or impregnation with fluid substances. In this process, carbon and/or silicon carbide coatings are deposited on the fibers or are formed from the fibers. The fibers can be sheathed in a series of one or more carbon or silicon carbide coatings, wherein a graduated system is possible as well, progressing from carbon to silicon carbide. Graduated in this sense means that preferably a continuous or nearly continuous transition is created.

The carbon is especially pyrocarbon.

Independently of the above, the outermost layer should be a SiC layer, especially generated via chemical vapor deposition, in order to achieve sufficient chemical stability. At the same time, the diffusion-barrier effect of silicon carbide ensures that a contamination of the substrate by impurities in the base material will not occur or may occur only to a slight extent.

The density of the substrate material is adjusted to between $0.1\ \text{g/cm}^3$ and $3.0\ \text{g/cm}^3$, wherein with increasing density, the strength and thermal conductivity of the substrate material increase, while the gas permeability decreases.

Differing from the known prior art, a framework made of carbon and/or silicon carbide fibers is used as the substrate—also called the susceptor—, which is stabilized via the formation or application of carbon or silicon carbide layers. The size of the coating can be used to adjust the porosity of the framework.

Independently of this, pore channels are statistically distributed or randomly arranged and isotropically distributed throughout the fiber structure of the framework, with gas that is to be applied to the object to be processed or cleaned flowing through said pore channels. The flow through the correspondingly randomly extending pore channels causes the retention time of the gas inside the substrate to increase, producing very even heating of the gas. Furthermore, due to the plurality of pore channels, a gas flow with a very high level of homogeneity can be achieved.

A method for producing a substrate of the type described at the beginning is characterized by the following process steps:

production of a framework made of carbon and/or SiC fibers and stabilization of the framework with at least one pyrocarbon and/or silicon carbide coating that forms a matrix, wherein a framework stabilized in this manner or a segment of the framework is used as the substrate.

In this, felt, fleece, and fabric layers can be used as the framework, which are comprised of or contain carbon or can be converted to carbon. This can be achieved, for example, via high-temperature carbonization. The framework is then stabilized via vapor infiltration (CVI) and/or fluid impregnation. In this, the fibers of the framework can be treated such that a sheathing of pure carbon or pure silicon carbide is created. It is also possible to apply a series of coatings of one or more carbon layers and/or one or more silicon carbide layers to the fibers. A graduated transition from carbon to silicon carbide is also possible.

Independently of the above, a silicon carbide layer should be formed as the outermost coating on the fibers, in order to achieve a high level of chemical stability.

By altering the composition of the framework and/or the duration of the treatment process for stabilizing the fibers and forming the coatings, the density, thermal conductivity, and/or porosity of the coated framework can be adjusted.

The invention is especially characterized in that one or more coatings of pyrocarbon and/or silicon carbide are applied to the framework that is comprised of carbon and/or SiC fibers, after which the substrate is cut from the matrix produced in this manner, the cut-out substrate is subjected to a high-temperature cleaning process, and one or more coatings of SiC are applied to the pyrocarbon layer.

Preferably, the ratio of framework to matrix ranges from 1:13 to 1:17, especially approximately 1:14.

The ratio of pyrocarbon to silicon carbide, which form the matrix, should range from 1:1.8 to 1:2, preferably approximately 1:1.86.

Preferably, the total density of the substrate ranges from 1.50 $g/cm^3$ to 1.9 $g/cm^3$, with the proportion of fibers being 0.098 $g/cm^3$ to 0.12 $g/cm^3$, the proportion of pyrocarbon 0.4 $g/cm^3$ to 0.8 $g/cm^3$ and the proportion of SiC 0.8 $g/cm^3$ to 1.0 $g/cm^3$. A corresponding substrate would have a thermal conductivity level of approximately 14 W/mK.

The substrate of the invention, made of a porous material, makes it possible to conduct gases through the substrate or susceptor during a treatment process. Thus, for example, the back surface of an object can be protected during an epitaxial process prior to deposition, as long as a cleaning or purifying gas is conducted through the susceptor. Furthermore, the cleaning gas can ensure that dopant atoms that escape from the back surface of the object during the epitaxial process are carried away with the gas flow, so that autodoping of the front surface of the object is substantially reduced.

The substrate of the invention is especially used when the front and back surfaces of an object are to be processed differently. In this case, the use of the substrate of the invention will allow an oxide layer that is present on all sides of an object to be etched in such a way that the oxide is removed in a targeted manner only from the front surface. An undefined introduction of etching gas between the substrate and the object, which can lead to a partial etching of the oxide layer in the boundary area of the back surface of the object, is prevented, thus as a consequence the oxide layer on the back surface is protected.

If the etching gas is conducted not only across the object but also through the substrate, then the back surface of the object can also be completely and evenly etched. The same applies to the doping of objects. Thus by using the porous substrate of the invention, the back surface of an object can be protected with cleaning gases against doping, or by supplying doping gases through the substrate an even doping of the front and back surfaces can be achieved.

BRIEF DESCRIPTION OF THE DRAWINGS

Further details, advantages and characterizing features of the invention are found not only in the claims and the characterizing features contained therein—alone and/or in combination—, but also in the following description of the preferred embodiments illustrated in the drawings, and in the subsequent examples.

The drawings show.

DESCRIPTION OF THE PREFERRED EMBODIMENTS

Figure 1:
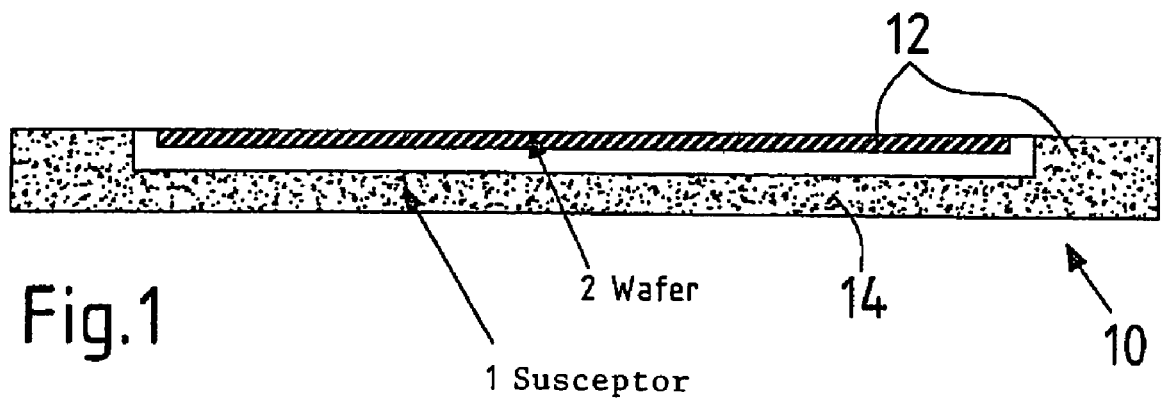
FIG. 1. a cross-section of a substrate with an object supported thereon.
Figure 2:
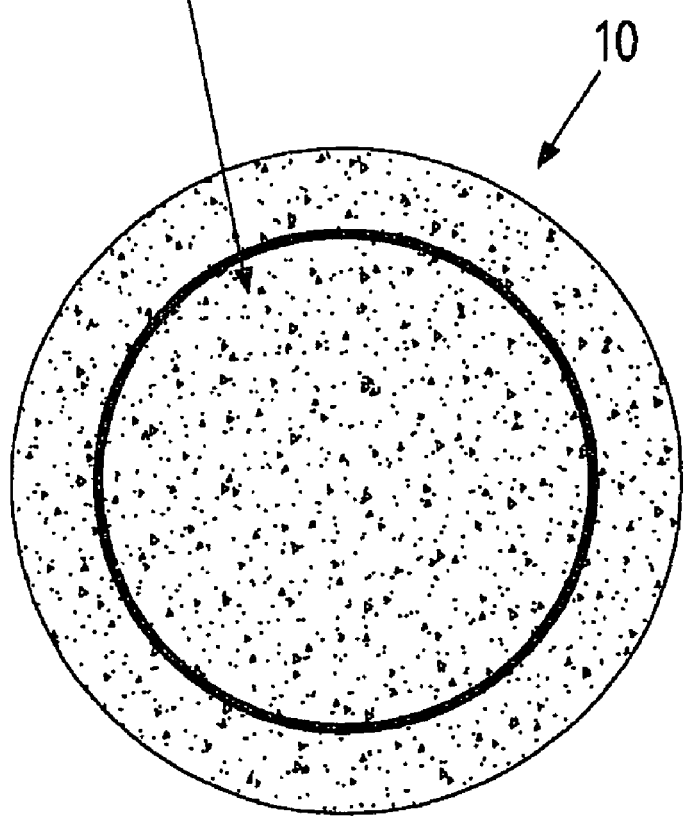
FIG. 2 a plan view of the substrate.

In FIG. 1 a substrate 10—also called a susceptor—is depicted, which is arranged in a process chamber that is not illustrated here and supports an object 12 to be treated or to be cleaned, which may be, for example, a wafer. The substrate 10 is circular from a plan view, as is shown in FIG. 2. Other geometries are also possible. In the exemplary embodiment the substrate 10 has a peripheral edge 12, up to which a base panel 14 extends, somewhat offset, above which the object 12 is arranged.

In other words, the substrate 10 is U-shaped in cross-section, with the object 12 to be treated or cleaned—hereinafter called the wafer—being arranged above the cross bar that forms the base panel 14.

According to the invention, the substrate 10 is comprised of a framework formed from carbon and/or silicon carbide fibers. Felt, fleece or fabric layers can be used as the material. If these are not present in carbon, a carbonization step can be performed beforehand. This is then followed by a stabilization of the fibers 16, 18 via vapor infiltration (CVI) with pyrocarbon (PyC) and/or silicon carbide (SiC). An impregnation with corresponding fluid substances may also be performed.

Figure 3:
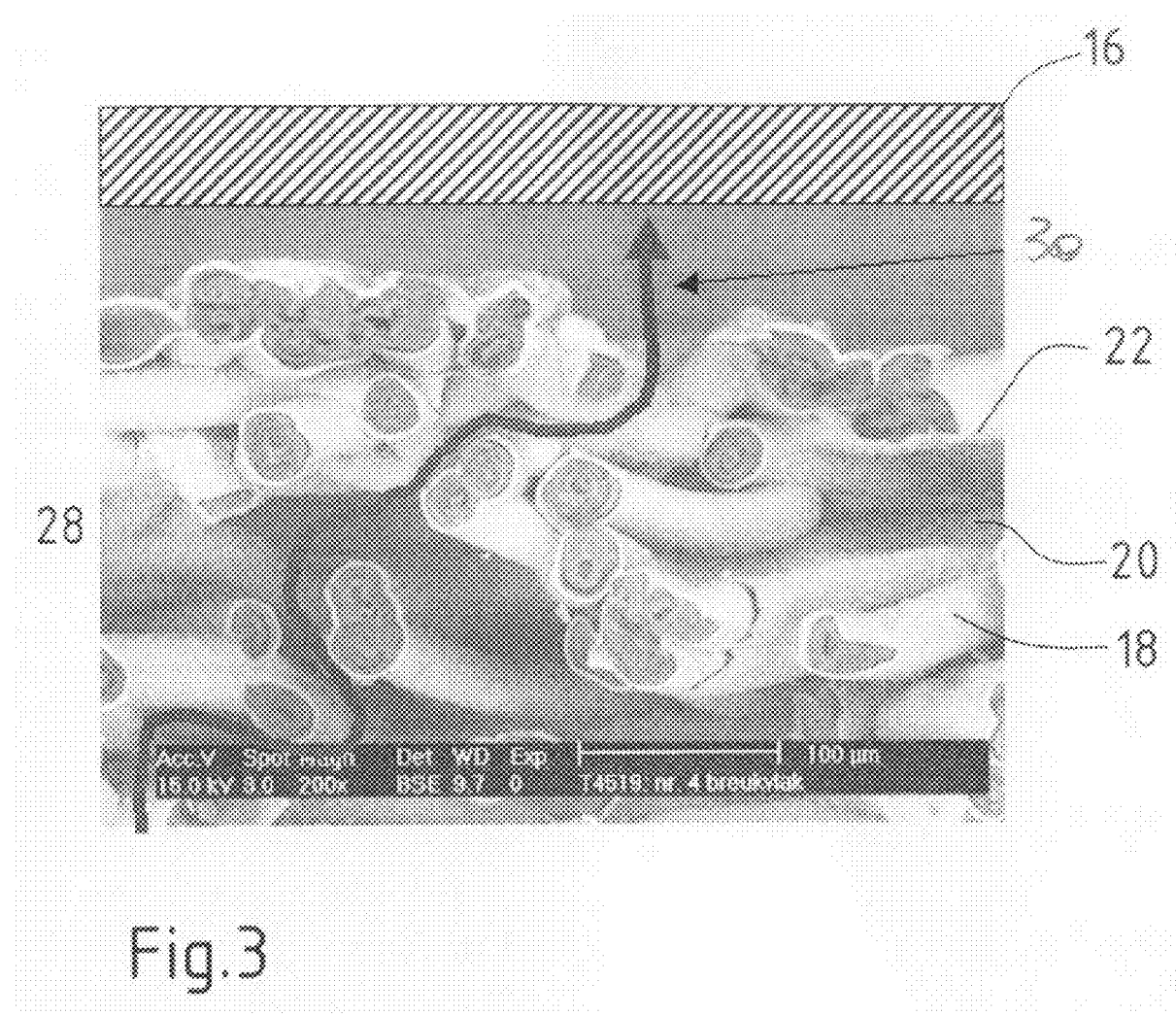
FIG. 3 an enlargement of the substrate according to FIGS. 1 and 2 along a fracture line, FIG. 4 an enlarged surface segment of the substrate according to FIGS. 1 through 3, and FIG. 5 a detailed illustration of a fiber of the substrate according to FIGS. 1 through 4.
Figure 5:
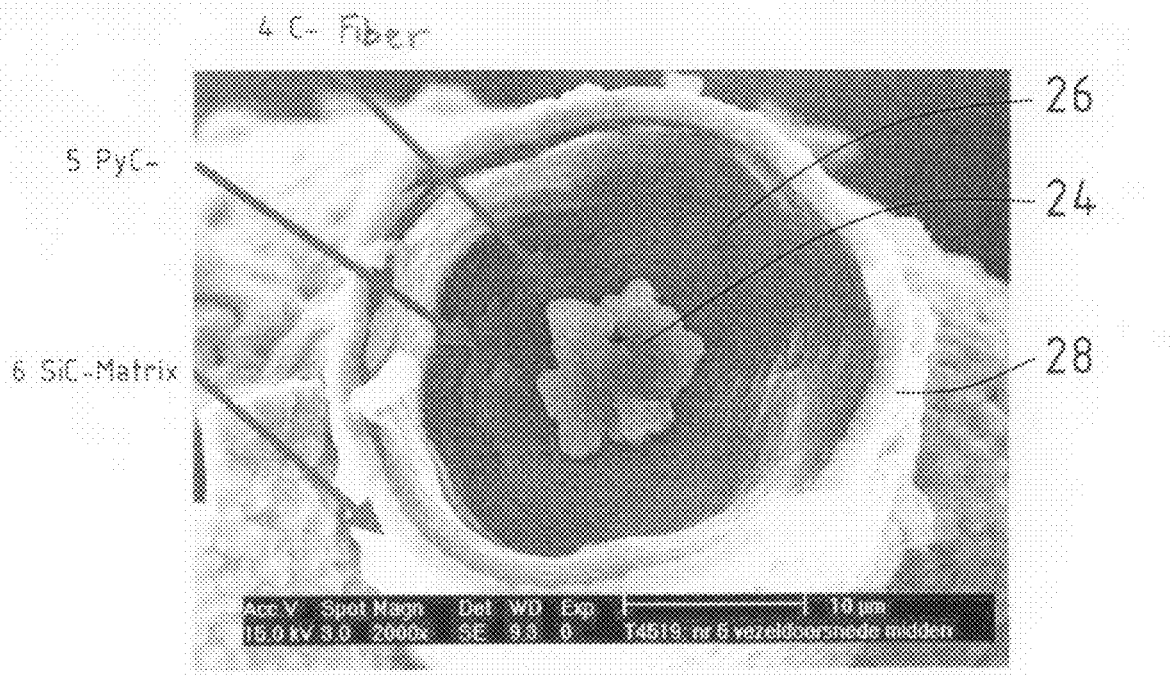

The coatings applied to the fibers 16, 18 are indicated in FIG. 3 by way of example with the reference numerals 20, 22. A more precise structure of the fibers equipped with the coatings is shown in FIG. 5. Here, by way of example, a carbon fiber is shown in cross-section, indicated by the reference numeral 24, which is sheathed in one or more pyrocarbon layers 26, which in turn are sheathed on the outside in one or more silicon carbide layers 28. A different sequence of coatings of pyrocarbon and silicon carbide may also be used.

The thickness of the applied coatings 26, 28 and the fiber diameters, along with their positioning relative to one another, can be used to adjust the free space between the coated fibers 18, 20, and thus the permeability. In other words, gas outlet or passage openings and their dispersal or course are determined by the porosity. Thus based upon the framework material a structure is created, which provides randomly arranged isotropically dispersed pore channels, through which gas can flow. A corresponding gas flow pathway is indicated as an example in FIG. 3 by an arrow (reference numeral 30).

Based upon this pathway, the gas flowing through the substrate 10 has a long residence time in it, so that even heating takes place. Furthermore, based upon the porosity, in other words based upon the plurality of very small channels, a highly homogeneous gas flow can be achieved. Because the dimensioning and arrangement of the gas outlet openings are not mechanically produced, but are instead determined by the structure of the framework and its coatings, advantages over substrates or susceptors with mechanically produced openings can be achieved that will ensure that objects supported by the substrate 10 of the invention can be reproducibly treated or coated to the desired extent.

Figure 4:
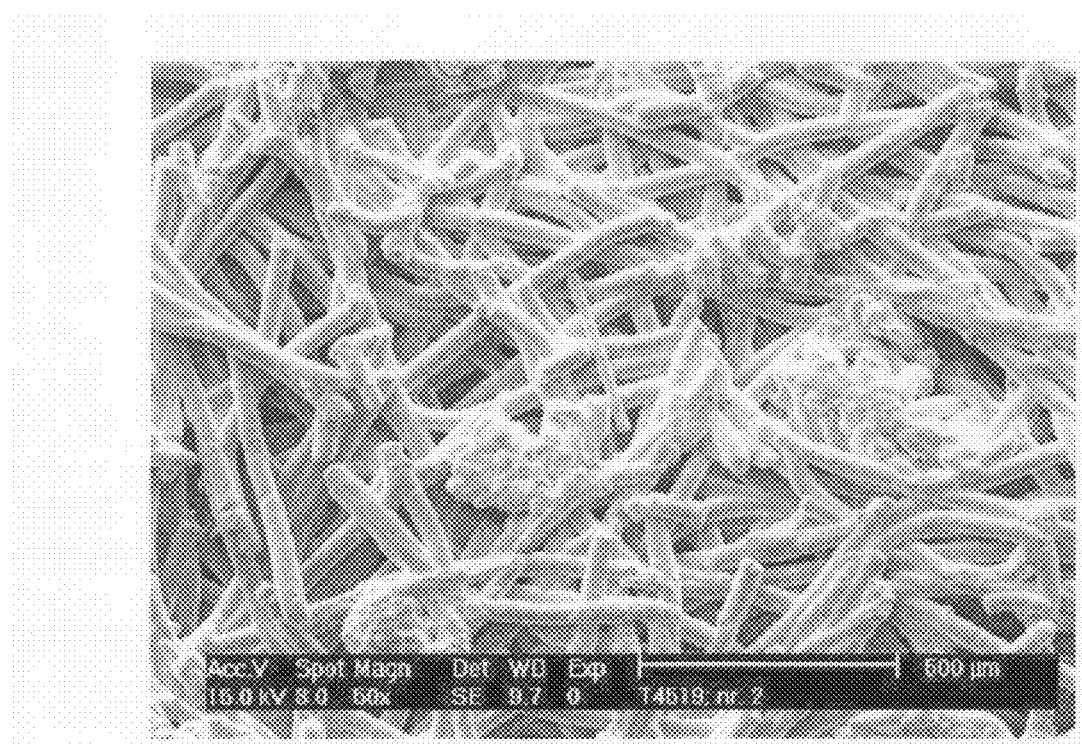

The randomly arranged, isotropically dispersed pore openings, in other words the ends of the pore channels, are shown in the representation in the image of FIG. 4.

Below, the invention will be described in greater detail with reference to an exemplary embodiment. As the base material for the substrate 10, a graphite felt having a total impurity level of less than 5 ppm can be used. Based upon the element that is used, the impurities lie below 0.05 ppm. A corresponding graphite felt characterized as the framework can be stabilized and sealed by means of vapor infiltration (CVI) using pyrocarbon (PyC) and silicon carbide (SiC). By varying the base material or altering the CVI steps, the physical properties of the matrix produced in this manner can be varied within broad margins, and adjusted to meet specific requirements. This is illustrated, by way of example, in the following tables.

Thus Table 1 illustrates the connection between material density and thermal conductivity.

| Variant | Density (g/cm$^3$) | Thermal conductivity (W/mK) |
| --- | --- | --- |
| A | 0.6 | 3.4 |
| B | 1.0 | 6.4 |
| C | 1.5 | 13 |
| D | 1.9 | 18 |

By varying the ratios of carbon fibers, pyrocarbon and silicon carbide, while retaining the same density, different thermal conductivity levels can be established.

Table 2 illustrates the connection between material density and porosity.

| Variant | Density (g/cm$^3$) | Porosity (%) |
| --- | --- | --- |
| A | 0.6 | 75 |
| B | 1.0 | 60 |
| C | 1.5 | 38 |
| C [sic] | 1.5 | 45 |
| E | 1.9 | 27 |

By varying the ratios of carbon fibers, pyrocarbon and silicon carbide, while retaining the same density, different porosity levels can be established.

Below, the invention will be described in greater detail with reference to an example, which will illustrate further details and advantages.

To produce a substrate a felt blank is first sealed with pyrocarbon. This can be accomplished in a CVI process, in which a decomposition of a carbon-containing gas (for example, methane) at temperatures between 800° C. and 1800° C. and at pressures between 0.01 mbar and 1013 mbar absolute is performed. This is followed by a processing of the sealed felt blank, in order to achieve the substrate geometry. The processing can be conducted automatically. A high temperature cleaning is then performed. In this process, the treated object is placed in a vacuum at ≧2,000° C. Halogen-containing gases are supplied to the reaction chamber. The high-temperature cleaning results in a total contamination level of <5 ppm in the axis, wherein per individual element a level of <0.05 ppm can be achieved, in each case based upon the initial weight. Finally, a sealing with silicon carbide is performed, preferably in a CVI process. In this, the decomposition of one or more silicon- and/or carbon-containing gases, such as methyltrichlorosilane, at temperatures between 800° C. and 1600° C. and pressures of between 0.01 mbar and 1013 mbar absolute is performed.

Alternatively, the sealing with pyrocarbon or sealing with silicon carbide can be accomplished by means of fluid impregnation. In this process, a matrix is applied by means of impregnation in carbon- and/or silicon-containing resins or solutions such as phenolic resin. Annealing is then performed in a vacuum or protective gas.

In order to alter the thermal conductivity of the substrate, for example while retaining the density and porosity levels, various starting felt blanks can be used. If, for example, Panox fibers are replaced by pitch fibers, due to the higher thermal conductivity of the fibers, with the same porosity, a higher thermal conductivity of the substrate results.

Substrates according to the invention can have diameters of up to 500 mm or more and/or thickness levels of up to 5 mm or more, for example.

If, preferably, a disk geometry for the susceptor is selected, then according to the teaching of the invention susceptors of other geometries can also be produced.

The invention claimed is:

1. A method for producing a gas permeable substrate for supporting an object for processing, the substrate comprising carbon and having pore channels for carrying gas interspersed through the substrate, the substrate having a first lateral surface at which the object is supported, and an opposite lateral surface, comprising the steps of:
obtaining a framework formed of at least one of a felt, a fleece and a fabric, and made of at least one of carbon fibers and SiC fibers, and
stabilizing the framework by at least one of vapor impregnation and fluid impregnation to form thereby at least one pyrocarbon and/or silicon carbide coating that forms a matrix, such that the stabilized framework has a porosity level that forms the pore channels,
said pore channels being disposed between the first lateral surface and the opposite lateral surface, and opening onto the first lateral surface and the opposite lateral surface, to enable gas flow from the opposite lateral surface to the first lateral surface for treatment of the object by the gas which has passed through the pore channels.

2. A method according to claim 1, wherein the fibers are stabilized solely with carbon or solely with silicon carbide.

3. A method according to claim 1, wherein the fibers are stabilized with a graduated system of coatings that transitions from carbon to silicon carbide.

4. A method according to claim 1, wherein the stabilized framework has a porosity p, where 5%≦p≦95%.

5. A method according to claim 1, wherein the stabilized framework has at least one planar surface.

6. A method according to claim 1, wherein the at least one of a felt, a fleece and a fabric is converted to at least one of carbon fibers and SiC fibers by high-temperature carbonization.

7. A method according to claim 1, wherein the gas permeable substrate has a thickness of at least 5 mm.

* * * * *